US007864528B2

(12) United States Patent
Milak

(10) Patent No.: US 7,864,528 B2
(45) Date of Patent: Jan. 4, 2011

(54) LIQUID COOLED HIGH-FREQUENCY FILTER

(75) Inventor: Ivan Milak, Oberer Paspelsweg (AT)

(73) Assignee: Harris Corporation, Melbourne, FL (US)

( * ) Notice: Subject to any disclaimer, the term of this patent is extended or adjusted under 35 U.S.C. 154(b) by 1164 days.

(21) Appl. No.: 11/491,707

(22) Filed: Jul. 24, 2006

(65) Prior Publication Data

US 2007/0022153 A1 Jan. 25, 2007

Related U.S. Application Data

(60) Provisional application No. 60/702,293, filed on Jul. 26, 2005.

(30) Foreign Application Priority Data

Jul. 25, 2005 (EP) ................................ 05106808

(51) Int. Cl.
*H05K 7/20* (2006.01)

(52) U.S. Cl. .................... 361/699; 333/22 R; 333/22 F; 361/698

(58) Field of Classification Search ............... 333/22 R, 333/22 F; 361/699
See application file for complete search history.

(56) References Cited

U.S. PATENT DOCUMENTS 4,516,088 A * 5/1985 Johnson et al. ............ 333/22 F
5,675,473 A * 10/1997 McDunn et al. ............. 361/699
5,949,298 A * 9/1999 Ives et al. .................. 333/22 F
6,060,966 A * 5/2000 Tennant et al. .............. 333/202
6,147,575 A * 11/2000 Hiratsuka et al. ........... 333/202
6,698,224 B2 * 3/2004 Kagaya et al. ............. 62/259.2
7,283,014 B2 * 10/2007 Johnson .................... 333/22 R

* cited by examiner

*Primary Examiner*—Gregory D Thompson
(74) *Attorney, Agent, or Firm*—Tarolli, Sundheim, Covell & Tummino LLP

(57) ABSTRACT

The invention refers to a high-frequency filter (1), comprising a filter housing (2), the filter housing (2) having at least one cover element (2*a*) with at least one resonator (5, 6, 7, 8, 9, 10, 11, 12) positioned therein and at least one signal input (3), through which a high frequency signal is coupled to the first resonator (5) and a signal output (4), through which a high frequency signal is coupled from the last resonator (10) to downstream appliances wherein the cover element (2*a*) is made from a thermally conductive material and the resonator (5, 6, 7, 8, 9, 10, 11, 12) is arranged to be in thermal connection with the cover element (2*a*). The cover element (2*a*) has at least one recess (23) arranged therein, along with a liquid coolant is guided in order to absorb thermal energy resulting from feeding the high frequency signal to the resonator (5, 6, 7, 8, 9, 10, 11, 12). The liquid cooled high-frequency filter according to the invention allows for an increased input power while retaining the physical dimensions of the filter assembly constant, thus, omitting resonator instabilities due to the development of higher TEM modes.

14 Claims, 4 Drawing Sheets

LIQUID COOLED HIGH-FREQUENCY FILTER

RELATED APPLICATIONS

This application claims the benefit of European Patent Application No. 05 106 808.8, filed Jul. 25, 2005 and U.S. Provisional Patent Application Ser. No. 60/702,293, filed Jul. 26, 2005.

The present invention relates to a high-frequency filter. Particularly, the present invention relates to a liquid cooled high-frequency filter, preferably for use in multi-frequency networks (MFNs) or single-frequency networks (SFNs) like digital video broadcasting (DVB) networks, which may include multimedia services like DVB-H or DVB-RCT and the like.

In the following description, the invention will be described with reference to a UHF bandpass filter for terrestrial DVB (DVB-T) applications. It is, however, pointed out that the scope of the present invention is not limited to such applications but relates to any high-frequency application, particularly VHF and UHF applications and most particularly SFN applications, such as mobile voice and data communication, encrypted communication networks and the like.

In DVB-T broadcasting technology, highly selecetive bandpass filters are used as transmitter output filters in order to reduce intermodulation products between adjacent DVD-T channels. In order to ensure error-free data transmission, it is of great importance to distribute the DVB-T signal with high quality of service (QoS) by complying with a spectral mask as defined in ETSI standard EN 300 744. According thereto, the transmitter has to meet the following spectral characteristics:

$$A(f_0\pm4.2\text{ MHz})\leqq-50.2\text{ dB};\ A(f_0\pm6\text{ MHz})\leqq-62\text{ dB};\ A(f_0\pm12\text{ MHz})\leqq-87\text{ dB},$$

where A is the attenuation at the respective frequency $f_0\pm\delta$.

On the other hand, in DVB-T broadcasting networks, the use of coded orthogonal frequency division multiplexing (COFDM) leads to an increased complexity in DVB-T coverage planning, as signal propagation constrains of COFDM signals may change the QoS from substantially error-free reception to a loss of signal (LOS) condition very abruptly. Therefore, in order to avoid QoS deterioration in areas, in which the signal strength has been high enough for analogue TV reception but may be insufficient for error-free DVB-T reception, such as indoor DVB-T reception, increased transmitter power may be required.

An increase in transmitter power usually involves the implementation of more sophisticated amplification means in order to prevent non-linearity products produced by the amplifier. However, building such linearized high power amplifiers is cost intensive and leads to more complex amplifier stages resulting in increased risk of failure.

A conceivable way to keep intermodulation products due to non-linearities of the amplifier at a low level or even reduce them while increasing amplification power is the application of highly selective output filter units following the transmitter amplifier in order to linearize the amplified signal before transmission by the transmitter antenna.

When using cavity resonators in such output filters, the selectivity of the resonator cavity deteriorates with an increase of its volume, as higher transverse electric and magnetic (TEM) modes in the UHF band occur. On the other hand, reducing the cavity volumes leads to increased current and field densities in the resonators as well as the resonator cavities resulting in thermal instability of the resonator and, thus, degraded performance of the filter. The use of thermally compensated resonators solves the problem of thermal instability only to a certain extent, particularly in appliances, in which the filter enclosure is subject to changes of the ambient temperature.

Based on this, it is an object of the present invention to provide a high-frequency filter, particularly for use in DVB-T applications, which exhibits high selectivity and stability even in high power transmitter applications.

It is another object of the present invention to provide a flexible high-frequency filter, particularly for use in DVB-T applications, which allows for a quick adaptation in frequency as well as power settings owing to changes in coverage as well as channel requirements.

A high-frequency filter of the invention comprises a filter housing having at least one cover element with at least one resonator positioned therein, a signal input, through which a high frequency signal is coupled to the first resonator, as well as a signal output, through which the filtered high-frequency signal is coupled from the last resonator to downstream appliances. The cover element is made form a thermally conductive material and is in thermal connection with the resonators positioned therein.

According to the invention, the cover element has at least one recess arranged therein, along which a liquid coolant is guided in order to absorb thermal energy resulting from feeding the high-frequency signal to the resonator.

Preferably, the high-frequency filter according to the invention comprises a tubing element, through which the liquid coolant flows and which is positioned inside the recess of the cover element, whereby the tubing element is in thermal connection with the cover element.

The provision of a filter housing, having a cover element with a recess, along which a liquid coolant is guided represents a very effective and advantageous way to dissipate thermal energy that is generated in the high-frequency filter and particularly the resonators due to high current and/or field densities.

Thereby, the liquid coolant provides a thermal energy sink having a high thermal capacity such that a sufficiently high amount of thermal energy can be dissipated in order to keep the high-frequency filter, and particularly the resonators, at thermally stable operating conditions, even if the electric current and/or field density is substantially higher when compared to high-frequency filters according to the state of the art.

For example, in DVB-T applications, output filters according to the state of the art are generally specified for a maximum input power of 2.5 kW (rms), this limit resulting from a balance between maximally tolerable thermal instabilities or maximally achievable temperature compensation, respectively, and minimally tolerable selectivity of the filter due to an increase in cavity dimensions.

For example, with an average insertion loss of 0.5 dB, a DVB-T UHF bandpass filter according to the state of the art working at an input power of 5 kW (rms), would exhibit a loss of about 500 W of electromagnetic field power, which will almost completely be converted to thermal energy, i.e. heat. According to Applicant's calculations, this would increase the filter enclosure's temperature by more than 50° C., thereby driving the filter's temperature out of the specified operating range.

The high-frequency filter according to the invention obviates this problem by providing means for guiding a liquid coolant, wherein the liquid coolant is provided in order to dissipate excess heat, which is generated by the conversion of electric and/or electromagnetic energy into thermal energy.

Thereby, the provision of a recess inside the cover element, along which the liquid coolant is guided allows for a simple construction of the liquid cooled high-frequency filter, for example by fitting a tubing element into the recess, through which the liquid coolant flows and which is in thermal connection with the cover element such that the liquid coolant represents a heat sink in the cover element.

In a preferred embodiment of the present invention, the tubing element is positively or non-positively fitted inside the recess of the cover element and/or in a material connection with at least parts of the walls of said recess. This ensures that thermal resistance at the interface of the tubing element and the recess walls is minimized in order to improve heat dissipation.

Most preferably, such material connections are made of thermally conductive paste or thermally conductive glue in order to decrease thermal resistance of interfacing portions.

The positioning of a tubing element inside the recess of the high-frequency filter results in a particularly simple arrangement with respect to producing and maintaining the high-frequency filter according to the invention.

Preferably, the tubing element is made from a different material than the cover element and most preferably from a material selected from a group comprising aluminium, zinc, copper, silver, gold, brass, bronze, alloys thereof or any other metals or alloys having a sufficiently high thermal conductivity, thermally conductive polymers and ceramics and the like, as well as combinations thereof. In a particularly preferred embodiment, the tubing element is made from a material having a higher thermal conductivity than the material, the cover element is made from.

In a particularly preferred embodiment, the recess of the cover element is at least partially covered with a closing element, whereby the closing element is fixed to the cover element by a bonding material, fixing means and/or positive or non-positive fit. Preferably, the bonding material is of high thermal conductivity in order to maximize dissipation of heat by the liquid coolant. Alternatively, the closing element may be fixed to the cover element by fixing means such as screws, clips and the like.

The closing element may either be used as retaining means in order to hold the tubing element inside the recess of the cover element in place or may function as an upper cover to provide a closed cross section along the total length of the recess, which may be sealed by a bonding material.

Most preferably, in order to allow for a precise and faultless fit of the tubing element inside the recess, the recess, in its direction of extension, has substantially no sharp edges but extends in a substantially straight and/or continuously curved direction. Thus, it is possible to easily and accurately fit a tubing element made from a comparatively soft material, such as copper, into the recess by bending the copper tubing element along the continuously curved recess and fixing it inside the recess using one or more closing elements.

Evidently, replacing such a tubing element can easily be done, which allows for simple maintenance of the high-frequency filter according to the invention in the field, i.e. without disconnecting or dismounting the high-frequency filter from its appliance.

In a particularly preferred embodiment of the present invention, at least one liquid coolant inlet and at least one liquid coolant outlet is provided, through which a liquid coolant is applied to and drained from the liquid coolant pathway, respectively. Providing a liquid coolant inlet and outlet allows for a simple installation or de-installation of the high-frequency filter of the invention and even enables to switch cooling cycles under operation of the high-frequency filter by disconnecting and reconnecting a liquid coolant source as well as a liquid coolant drain to the inlet and outlet ports, respectively.

Particularly preferably, the liquid coolant inlet and/or outlet port comprises valve means preventing liquid coolant to leak out of the liquid coolant pathway in case the inlet and/or outlet port exhibits a connection fault or the liquid coolant source and/or drain is disconnected from the respective inlet and/or outlet port.

Most preferably, the high frequency filter according to the invention comprises at least one resonator cavity, which is associated with said resonator. Preferably, in a multiple resonator filter assembly, an equal number of resonator cavities is provided, where each resonator cavity is associated with one resonator. Preferably, the resonator cavities are of a cubic, cylindrical or spherical shape.

In a particularly preferred embodiment of the present invention, the resonator is tuneable, preferably tuneable from 650 MHz to 700 MHz, more preferably tuneable from 600 MHz to 750 MHz, yet more preferably tuneable from 550 MHz to 800 MHz, most preferably tuneable from 500 MHz to 850 MHZ, and particularly preferably tuneable from 470 MHz to 860 MHz. Thus, the resonators and, consequently, the high frequency filter can be used in the whole UHF frequency band and are particularly well-suited for DVB-T applications, even if general frequencies are changed by the authorities or coverage constraints require a modification of the operating frequencies of the high-frequency filter.

Preferably, the high-frequency filter according to the invention comprises inductive and/or capacitive coupling means, which are used in order to couple multiple resonator cavities by inductive and/or capacitive coupling. Preferably, the coupling means have an electrical length of $\lambda/4$, i.e. ¼ of the wavelength corresponding to the center frequency $f_0$ of the high-frequency filter.

In a particularly preferred embodiment of the present invention, the high-frequency filter comprises a multitude of resonators and associated resonator cavities, which are most preferably coupled to form a serial arrangement of preferably three, more preferably four, most preferably five, and particularly preferably six, eight or more cavity resonators. The serial coupling of multiple cavity resonators increases selectivity of the high-frequency filter and, thus, allows for a narrow band filtering of a high-frequency signal.

In yet another preferred embodiment of the present invention, at least two cavity resonators, which are not coupled by the serial arrangement of the multiple cavity resonators, are cross-coupled, most preferably by a capacitive coupling of the first and the last cavity resonator, the second and the penultimate cavity resonator, and most preferably the second and the fifth cavity resonator of a serial arrangement of six cavity resonator. Cross-coupling cavity resonator in a serial resonator arrangement leads to an increased attenuation in the upper and/or lower edge region of the passband of the high-frequency filter according to the invention and, thus, an even further increased filter selectivity.

In order to even further increase selectivity of the high-frequency filter according to the invention, a particularly preferred embodiment of the present invention includes at least one and preferably two notch cavity resonators, coupled to at least one other cavity resonators of the high-frequency filter. In a particularly preferred embodiment having two notch cavity resonators, the first notch cavity resonator is coupled to a first cavity resonator and the second notch cavity resonator is coupled to a last resonator. In another preferred embodiment having two notch cavity resonators, the first notch cavity resonator is coupled to a second cavity resonator and the second notch cavity resonator is coupled to a penultimate resonator and the like.

Particularly preferred liquid coolants for a high frequency filter according to the inventions include water, liquid ammonia, liquid carbon dioxide ($CO_2$) or any other liquid, preferably having a high thermal capacity. Further, the liquid coolant may include additives in order to reduce corrosion and precipitation of unwanted material inside the liquid coolant pathway.

All embodiments of the present invention, as previously described, as well as any combination thereof provide high power high-frequency filters with an increased temperature stability while having a compact design that prevents the development of higher TEM modes. Further, high flexibility regarding operation frequency and power are achieved.

Additional features and advantages of the present invention may be taken from the following detailed description of a particularly preferred embodiment with reference to the drawings, in which FIG. 1 shows a schematic circuit diagram of a liquid cooled high-frequency bandpass filter for DVB-T applications according to the invention;

Figure 1:
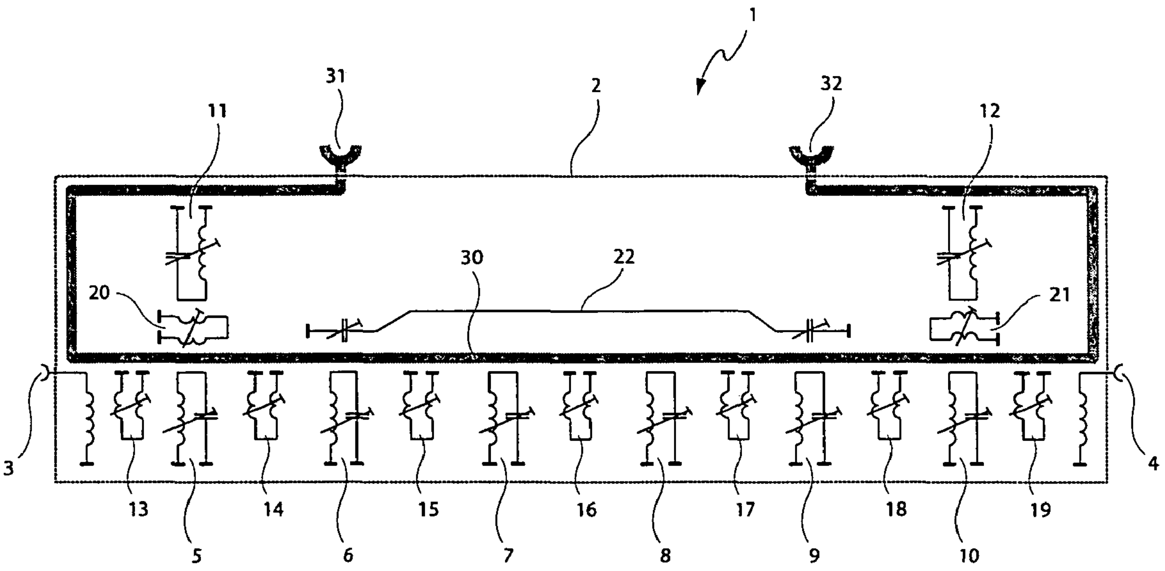

FIG. 1 shows a schematic circuit diagram of a high-frequency filter according to the invention, particularly for use in terrestrial DVB appliances. According thereto, the filter 1 comprises a filter housing 2, having a signal input port 3 as well as a signal output port 4 for coupling a DVB-T UHF signal from an output amplifier to the first resonator 5 via inductive input coupling means 13. The first resonator 5 represents the first resonator element in a serial circuit of six resonator elements represented by resonators 5, 6, 7, 8, 9 and 10, whereby resonator 10 represents the last resonator in the serial resonator circuit. The last resonator 10 is inductively coupled to the signal output 4 resulting in a coupling of the filtered DVB-T UHF signal from the last resonator to downstream appliances, such as antennas and the like.

The resonators 5, 6, 7, 8, 9 and 10 of the serial resonator circuit are inductively coupled by coupling means 14, 15, 16, 17 and 18. The resonators 5, 6, 7, 8, 9 and 10 of the serial resonator circuit are bandpass resonators such that a signal, having substantially the center frequency of the respective resonator, passes said resonator from its input coupling to its output coupling.

Most preferably, the high-frequency filter according to the embodiment of FIG. 1 is designed in λ/4 technology, i.e. the electrical lengths of inductive couplings 13, 14, 15, 16, 17, 18, 19 are such that they correspond to ¼ to the wave length of the center frequency $f_0$, in order to maximize impedance matching, which results in an optimized coupling between the cavity resonators and, thus, in a minimization of the total insertion loss of the filter.

Figure 4:
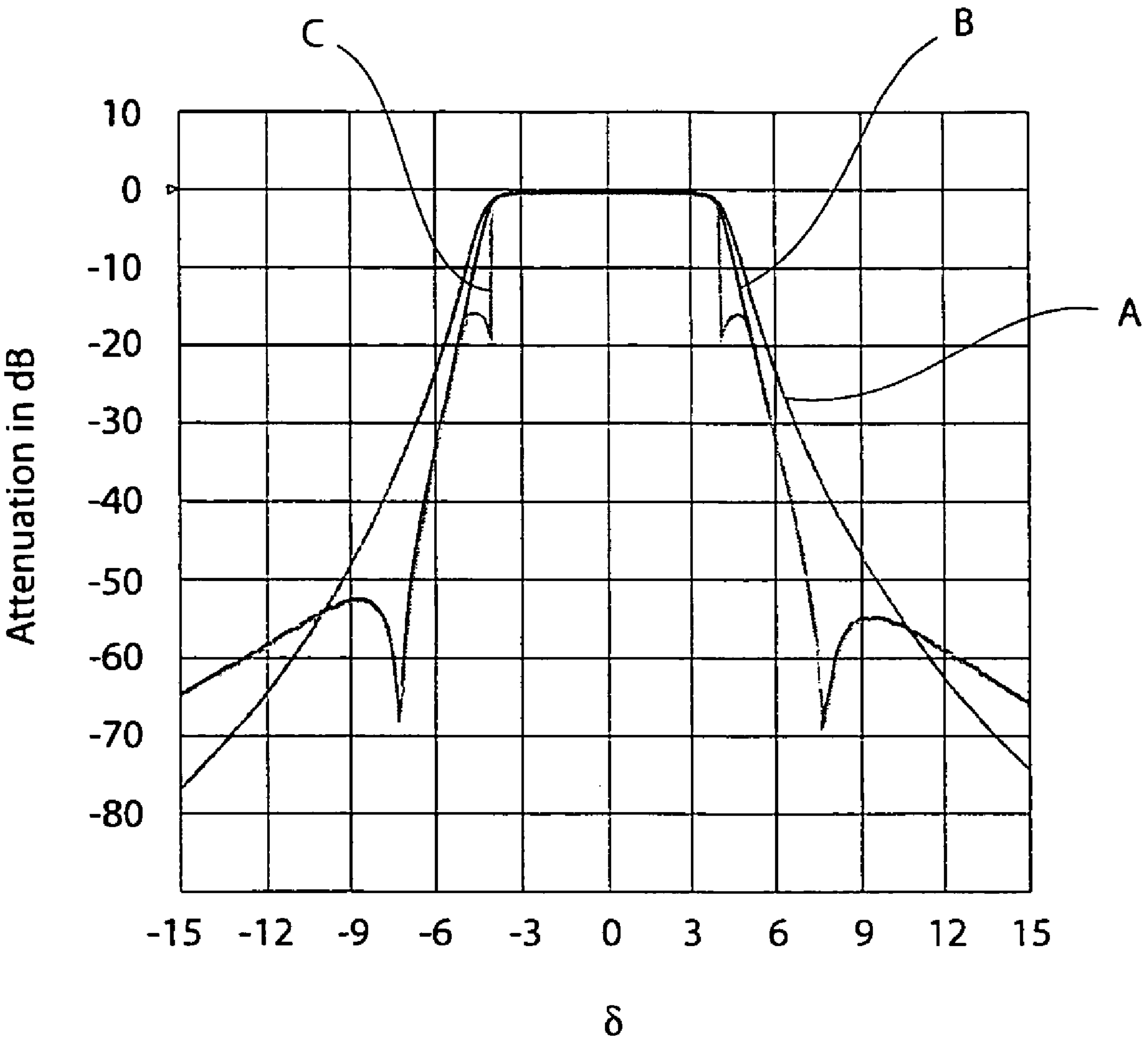
FIG. 4 shows attenuation and spectral characteristics of the serial circuit of six bandpass cavity resonators shown herein.

As can be taken from FIG. 4, in which A represents the spectral characteristics of a serial circuit of 6 band pass cavity resonators, a very selective bandpass filter is provided, having the following characteristics:

$$A(f_0\pm 6\text{ MHz})\geqq -20\text{ dB};\ A(f_0\pm 12\text{ MHz})\geqq -60\text{ dB},$$

where A is the attenuation at the respective center frequency $f_0$=666 MHz and δ represents the difference from the center frequency in MHz.

Although good selectivity is achieved by a serial arrangement of six bandpass cavities, ETSI standard EN 300 744 spectral mask requirements may not be met. In order to increase selectivity, the filter according to the embodiment of FIG. 1 further comprises a capacitive cross coupling between resonators 6 and 9, i.e. the second and fifth resonator of the serial arrangement of six resonators. This leads to an increased selectivity for $f_0\pm 6$ MHz of about 7 dB (see FIG. 4, B).

In order to increase selectivity at $f_0\pm 4.2$ MHz, notch cavity resonators 11, 12 are inductively coupled by coupling means 20, 21 to the first and last resonator 5, 10, respectively, of the serial resonator assembly. The provision of notch resonators 11, 12 leads to an increased selectivity of $f_0\pm 4.2$ MHz≧15 dB (see FIG. 4, C), resulting in a frequency characteristic of the bandpass filter according to the embodiment of FIG. 1, which meets ETSI standard EN 300 744.

As in the case of inductive coupling means 13-19, inductive coupling means 20, 21 have an electrical length of λ/4, in order to optimize the coupling between the notch cavity resonators and the respective bandpass resonators 5 and 10.

Preferably, as shown in FIG. 1 all resonators and coupling means are tuneable, which allows the filter to be used in the UFH frequency range, i.e. 470 to 862 MHz, by adjusting the center frequencies of the resonators as well as the electrical length of the coupling means.

FIG. 1 schematically shows a liquid cooling pathway 30, having an input port 31 and an output port 32. The liquid coolant pathway is constructed to be in good thermal conductivity with the resonators 5 to 12.

Figure 2:
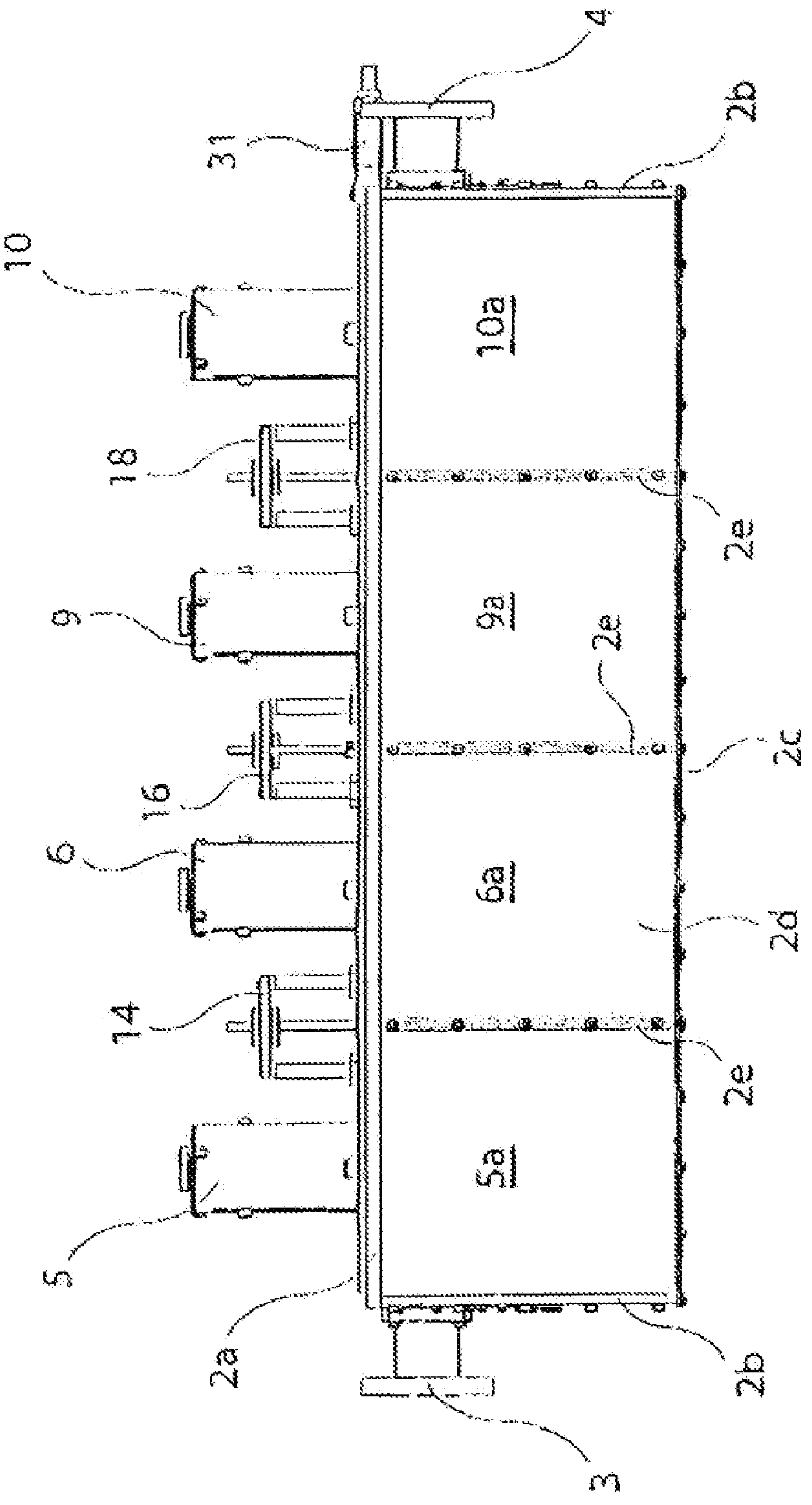
FIG. 2 shows a side view of the bandpass filter according to the schematic circuit diagram of FIG. 1.

FIG. 2 shows a side view of a high frequency output filter according to the invention. The filter housing consists of a bottom element 2*c*, side elements 2*b* and 2*d*, as well as a cover element 2*a*. The elements 2*a*, 2*b*, 2*c* and 2*d* define an inner volume of the high-frequency filter, which is subdivided by longitudinal and lateral partition walls 2*e*, defining multiple cavities of the filter enclosure of substantially identical volume. The cavities 5*a*, 6*a*, 9*a*, 10*a* define resonator cavities which, in combination with resonators 5, 6, 9 and 10, form cavity resonators as is known to the skilled person.

As can be taken from FIG. 2, the resonator cavities are of substantially rectangular shape. Signal input and output ports 3, 4 are arranged at opposed sidewalls 2*b* of the filter housing.

The bottom, side and cover elements 2*c*, 2*b*, 2*d* and 2*a* are made of sheet metal plates and most preferably aluminium or aluminium alloy plates. These sheet metal plates are interconnected and fixed in place by fixation means and most preferably metal screws. Likewise, the partition elements 2*e*, which are arranged inside the volume defined by the sheet metal plates 2*a*-2*d*, are connected and fixed in place by fixation elements, such as screws or the like. The interconnection of the sheet metal plates is preferably sealed by a sealing/bonding material, which provides good electrical conductivity between the metal plates.

As shown in FIG. 2, cover element 2*a* is made of a sheet metal plate having a greater thickness than bottom and side elements 2*c*, 2*b* and 2*d*, in order to enable for good thermal conductivity as well as provide sufficient material thickness in order to house recess 23.

Figure 3:
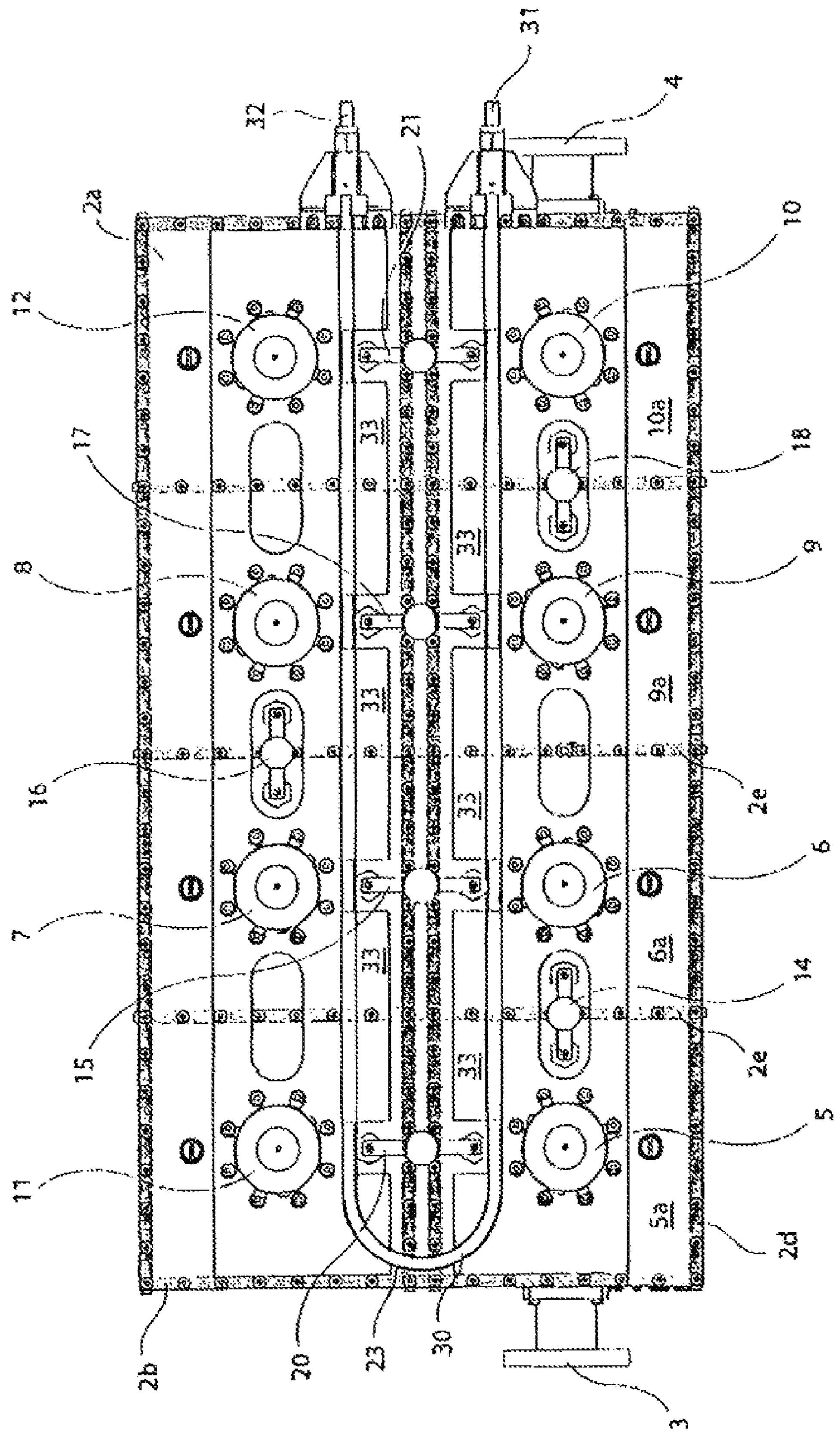
FIG. 3 shows a top view of an embodiment of a bandpass filter according to the circuit diagram of FIG. 1.

FIG. 3 shows a top view of the filter assembly according to FIG. 2. In FIG. 3, the resonator cavities are arranged in two adjacent rows of four resonators. Thereby, the serial resonator arrangement of six bandpass cavity resonators 5, 6, 7, 8, 9, 10 is folded to extend longitudinally and laterally across the cross section of the resonator housing defined by sidewalls 2*b* and 2*d*. Notch cavity resonators 11 and 12 are arranged adjacent to the respective first and last resonator of the serial resonator arrangement 5-10 such that the filter assembly has a substantially rectangular outer shape.

As is shown in FIG. 3, the resonators 5-12 are arranged substantially centered with reference to the resonator cavities 5*a* to 12*a*. Again, the substantially rectangular shape of the resonator cavities 5*a* to 12*a* is shown in FIG. 3.

FIG. 3 also shows recess 23 in the covering element 2*a* of the high-frequency filter device, in which a tubing element 30 is arranged and fixed by closing elements 33. Preferably, closing elements 33 are fixed to cover element 2*a* by fixing elements, such as screws, clips or the like.

Tubing element 30 comprises inlet and outlet ports 31 and 32, which, in the present case, include automatic valve means sealing the tube element 30 as soon as connecting means of a liquid coolant source and drain, respectively, are disconnected from the inlet and outlet ports 31, 32.

In a high-frequency filter as shown in FIG. 3, dissipating excess heat from the cavity resonators using a liquid coolant allows to use the high-frequency filter in 5 kW applications. Thereby, the maximum input power specification of bandpass filters for use in DVB-T transmitter applications is doubled, while the physical dimensions of the filter assembly are kept constant, thus, ensuring increased selectivity and stability of the filter by omitting the development of higher harmonic TEM modes.

The invention claimed is:

1. High-frequency filter comprising a filter housing, the filter housing having at least one cover element with a resonator positioned therein;

at least one signal input, through which a high frequency signal is coupled to the resonator and a signal output, through which a high frequency signal is coupled from the resonator to downstream appliances;

wherein the cover element is made from a thermally conductive material and the resonator is arranged to be in thermal connection with the cover element; and wherein:

the cover element has at least one recess arranged therein, along which a liquid coolant is guided in order to absorb thermal energy resulting from feeding the high frequency signal to the resonator.

2. High frequency filter according to claim 1, wherein:

at least one tubing element, through which the liquid coolant flows, is positioned inside the recess of the cover element, whereby the tubing element is in thermal connection with the material of the cover element.

3. High frequency filter according to claim 2 wherein:

the at least one tubing element and/or the cover element is made from a material selected from a group comprising aluminum, zinc, copper, silver, gold, brass, bronze, alloys thereof or any other metals or alloys having a sufficiently high thermal conductivity, thermally conductive polymers, as well as combinations thereof.

4. High frequency filter according to claim 2, wherein:

the at least one tubing element is made from a different material than the cover element and preferably from a material having a higher thermal conductivity than the cover element.

5. High frequency filter according to claim 1, wherein:

the recess of the cover element is at least partially covered with at least one closing element, whereby the closing element is fixed to the cover element by a bonding material.

6. High frequency filter according to claim 1, wherein:

at least one liquid cooling inlet and at least one liquid cooling outlet is provided through which a liquid coolant is applied to and drained from, respectively.

7. High frequency filter according to claim 6, wherein the inlet and/or outlet comprises valve means, preventing liquid coolant to leak in case the inlet and/or outlet is incorrectly connected or disconnected from a cooling liquid source or drain, respectively.

8. High frequency filter according to claim 1, wherein the filter housing comprises at least one resonator cavity, which is associated with said resonator to form a cavity resonator.

9. High frequency filter according to claim 1, wherein:

the resonator is tunable, preferably tunable from 650 MHz to 700 MHz, more preferably tunable from 600 MHz to 750 MHz, yet more preferably tunable from 550 MHz to 800 MHz, most preferably tunable from 500 MHz to 850 MHz and particularly preferably tunable from 470 MHz to 862 MHz.

10. High frequency filter according to claim 1, including:

multiple cavity resonators, inductive and/or capacitive coupling means are provided in order to couple multiple cavity resonators, the coupling means having an electrical length of $\lambda/4$.

11. High frequency filter according to claim 10, wherein:

a serial arrangement of multiple cavity resonators, particularly bandpass cavity resonators is coupled by said inductive and/or capacitive coupling means, the arrangement having preferably 3, more preferably 4, most preferably 5, particularly preferably 6 or 8 or more resonators.

12. High frequency filter according to claim 11, wherein:

a cross coupling of at least two of said cavity resonators, which are not coupled by said serial coupling, preferably the first and last cavity resonator, and most preferably the second and penultimate cavity resonator.

13. High frequency filter according to claim 10, wherein:

at least one notch cavity resonator, which is coupled to a bandpass cavity resonator, and most preferably two notch cavity resonators, which are coupled to the first and last cavity resonators or to the second and penultimate cavity resonators.

14. Use of a high frequency filter according to claim 1 in a bandpass filter and/or a band-stop filter.

* * * * *